(12) United States Patent
Olen et al.

(10) Patent No.: US 8,933,758 B1
(45) Date of Patent: Jan. 13, 2015

(54) BRIDGE-STABILIZED OSCILLATOR WITH FEEDBACK CONTROL

(71) Applicants: Vadim Olen, Cedar Rapids, IA (US); Russell D. Wyse, Center Point, IA (US)

(72) Inventors: Vadim Olen, Cedar Rapids, IA (US); Russell D. Wyse, Center Point, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 13/954,067

(22) Filed: Jul. 30, 2013

(51) Int. Cl.
*H03B 5/12* (2006.01)
*H03B 5/14* (2006.01)
*H03L 5/02* (2006.01)

(52) U.S. Cl.
CPC ..................................... *H03L 5/02* (2013.01)
USPC ............................................ 331/138; 331/109

(58) Field of Classification Search
USPC ..................................... 331/109, 138–142
See application file for complete search history.

(56) References Cited

U.S. PATENT DOCUMENTS

| | | | | |
|---|---|---|---|---|
| 2,173,427 A | * | 9/1939 | Scott | 331/138 |
| 2,379,694 A | * | 7/1945 | Edson | 331/138 |
| 2,495,177 A | * | 1/1950 | Norde | 331/140 |
| 4,038,609 A | * | 7/1977 | Langberg | 331/65 |
| 4,588,968 A | * | 5/1986 | Wile | 331/109 |
| 6,064,277 A | * | 5/2000 | Gilbert | 331/117 R |
| 8,228,130 B1 | * | 7/2012 | Ivanov et al. | 331/116 M |
| 2012/0306583 A1 | * | 12/2012 | Delzer et al. | 331/109 |

OTHER PUBLICATIONS

Meacham, L. A., "The Bridge Stabilized Oscillator", Bell System Technical Journal, vol. 17, pp. 574-591, Oct. 1938.
U.S. Appl. No. 13/714,209, filed Dec. 13, 2012 "Ultra-Precision Linear Phase Shifter With Gain Control".
U.S. Appl. No. 13/737,777, filed Jan. 9, 2013 "High-Dynamic Range Precision Variable Amplitude Controller".

* cited by examiner

*Primary Examiner* — Joseph Chang
(74) *Attorney, Agent, or Firm* — Angel N. Gerdzhikov; Donna P. Suchy; Daniel M. Barbieri

(57) ABSTRACT

A bridge-stabilized oscillator with feedback control includes an RF amplifier connected to a first bridge path and a second bridge path. Each first and second bridge path has a variable gain amplifier to receive and modify the respective signals to maintain the resistance of a resistor in the first bridge path, so the resonator in the second bridge path oscillates. A power detector provides a control signal to each of the variable gain amplifiers to maintain the phase of the output with respect to the input and constrain the gain in each of the first and second bridge paths.

20 Claims, 1 Drawing Sheet

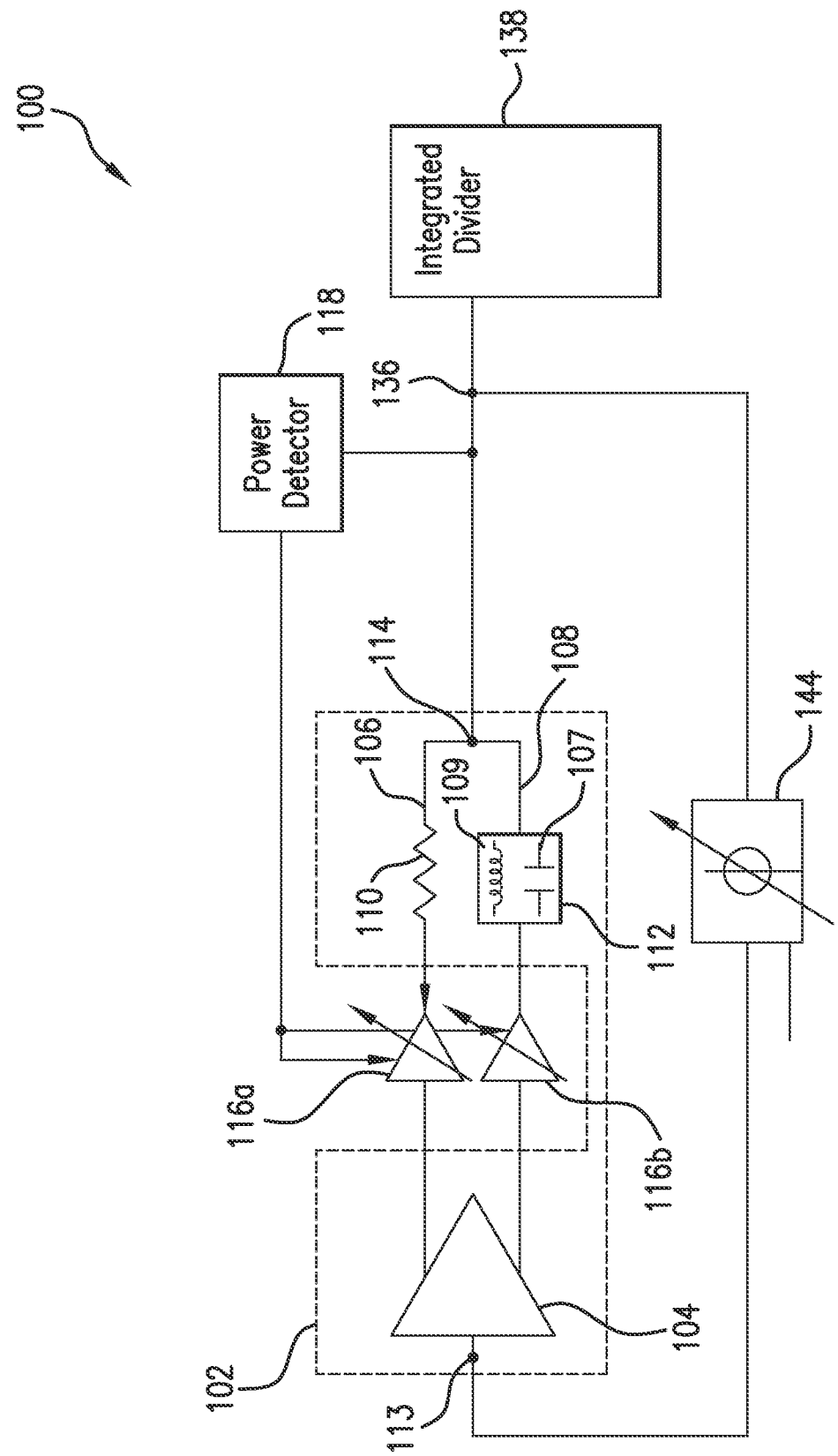

BRIDGE-STABILIZED OSCILLATOR WITH FEEDBACK CONTROL

BACKGROUND

This invention relates to oscillator circuits and, more particularly, to a circuit that incorporates a bridge-stabilized oscillator with feedback control for generating an oscillator signal having a relatively low rate of energy loss.

High precision oscillators are required in many electronic devices as a master clock or frequency source, from which all other time intervals and operational frequencies are derived. Quartz crystal resonators are often used in such oscillators because the resonant frequency of the crystal is very stable. However, quartz crystal resonators are expensive and physically large with a large footprint.

SUMMARY OF THE INVENTION

A bridge-stabilized oscillator with feedback control is disclosed. The oscillator includes an RF amplifier to convert a single input signal to a first bridge input signal and a second bridge input signal and provide those signals across a first bridge path and a second bridge path. Each bridge path has a variable gain amplifier to receive and modify the first bridge input signal and the second bridge input signal. A resistor is connected in series with the variable gain amplifier in the first bridge path and a resonator is connected in series with the variable gain amplifier in the second bridge path. A power detector provides a control signal to each of the variable gain amplifiers to maintain the phase of the output with respect to the input and constrain the gain in each of the paths.

BRIEF DESCRIPTION OF THE DRAWINGS

The features and advantages of the present invention will be apparent by reference to the following detailed description of the illustrated embodiments when taken in conjunction with the following list of drawings, where like reference numerals refer to like elements:

FIG. 1 is a schematic of a bridge-stabilized oscillator with feedback control.

DETAILED DESCRIPTION OF THE EMBODIMENTS

FIG. 1 shows a bridge-stabilized oscillator with feedback control circuit 100. Circuit 100 includes a bridge-stabilized oscillator 102. Bridge-stabilized oscillator 102 includes an RF amplifier 104 with a relatively high input and output impedance that converts an unbalanced single-ended single input signal to a balanced differential output signal. The output signal is provided across two parallel paths 106, 108 that correspond with a first bridge input signal to first bridge path 106 and a second bridge input signal to second bridge path 108. First bridge path 106 includes a resistor (resistive load) 110 and second bridge path 108 includes a resonator 112, which provides an oscillating output signal.

Any type of resonator 112 can be used. In fact, circuit 100 can compensate for lower quality-factor components in resonator 112. Resonator 112, for example, can be a metal-insulator-metal (or other type) capacitor 107 in parallel or series with a wire bond (or other type) inductor 109. The shape of wire bond inductor 109 can be tuned to correspond with the capacitance of capacitor 107 to inexpensively obtain the desired resonance frequency of resonator 112.

Bridged-stabilized oscillator 102 maintains constant phase at output node 114 with respect to the input at input node 113 to RF amplifier 104 by summing the output of first bridge path 106 and second bridge path 108. The phase at output node 114 is held constant by operating first bridge path 106 180 degrees out of phase with respect to second bridge path 108 and summing the output of first bridge path 106 and the output of second bridge path 108. Bridged-stabilized oscillator 102 also maintains a slightly unbalanced gain difference between first bridge path 106 and second bridge path 108, so that bridged-stabilized oscillator 102 can oscillate at the desired resonance frequency.

A variable gain amplifier (VGA) 116a, 116b in each first bridge path 106 and second bridge path 108, respectively, provides feedback control for each first bridge path 106 and second bridge path 108. By controlling the gain in each first bridge path 106 and second bridge path 108, circuit 100 compensates for the changing resistance in resistor 110. A power detector 118 detects the amplitude of the output signal at output node 114 and provides a first control signal to VGA 116a in first bridge path 106 and a second control signal to VGA 116b in second bridge path 108. The amplitude of an RF signal is the difference between its maximum and its minimum value during one cycle, and is measured in volts. The amplitude is directly related to the strength, or power, of the RF signal. In that regard, by determining the amplitude of the RF signal at output node 114, power detector 118 quantifies the signal strength and can determine the relative gain between input node 113 and output node 114.

Power detector 118 in cooperation with VGAs 116a and 116b maintains the gain with respect to paths 106 and 108 almost identical, predictably in the 0.01 to 0.2 dB range or any range therebetween, although some circuits may tolerate a higher dB gain. This slightly unbalanced gain difference between first bridge path 106 and second bridge path 108 at output node 114 permits precise control of the resonance frequency by maintaining the phase of the output signal with respect to the input signal.

VGAs 116a and 116b maintain a constant phase relationship across all gain stages. A slight variation in phase of the signal in first bridge path 106 with respect to second bridge path 108 will produce an output signal at output node 114 that is out of phase with respect to the input signal to RF amplifier 104. So for every change in gain provided by VGAs 116a and 116b, it is desirable that the phase remain substantially unchanged, otherwise the desired resonance frequency cannot be maintained. According to one embodiment, VGAs 116 may be a high-dynamic range amplitude controller, such as the one disclosed in U.S. non-provisional patent application entitled, "HIGH-DYNAMIC RANGE PRECISION VARIABLE AMPLITUDE CONTROLLER," Ser. No. 13/737,777, filed on Jan. 9, 2013 and commonly owned with the present application, the entirety of which is hereby incorporated by reference.

A digital signal can be provided to an on-chip integrated divider 138 that allows the user to decrease the output frequency. For example, where an operator may desire a 10 MHz oscillator, which would take up substantial die space, circuit 100 could be designed to provide a 100 MHz oscillation and divider 138 can divide the oscillation by 10 to produce the 10 MHz signal.

A variable phase shifter (VPS) 144 combined in a feedback loop between power detector 118 and RF amplifier 104 allows highly linear phase control of circuit 100. In that regard, the resonance frequency of circuit 100 can be precisely tuned with a tuning signal from an external source without impacting the gain of circuit 100. According to one embodiment, VPS 144 may be an ultra-precision phase shifter, such as the one disclosed in U.S. non-provisional patent application entitled, "ULTRA-PRECISION LINEAR PHASE SHIFTER WITH GAIN CONTROL," Ser. No. 13/714,209, filed on Dec. 13, 2012, and commonly owned with the present application, the entirety of which is hereby incorporated by reference.

The present disclosure is implemented in the context of a BJT-based integrated circuit on a single piece of semiconductor containing the entire oscillator 100 on a single integrated circuit. Any combination of FET-based and BJT-based components, however, may be selectively arranged to produce the desired design requirements. These components can be manufactured using various fabrication technologies, including on a semiconductor substrate such as silicon (SI) substrate, silicon-germanium (Si—Ge) substrate, gallium-arsenide (GaAs) substrate, or gallium-nitride (GaN) on silicon substrate, and various transistor types, including bipolar terminal transistor (BJT), metallic oxide semiconductor (MOS), complementary metallic oxide semiconductor (CMOS), a bipolar CMOS (Bi-CMOS), heterojunction bipolar transistor (HBT), metal semiconductor field effect transistor (MES-FET) and high electron mobility transistor (HEMT) design technologies.

Bridge-stabilized oscillator with feedback control circuit 100 is intended for operation in the 100 MHz to 10 GHz range, or any range therebetween, but is a useful circuit at any in any frequency range, including in the terahertz range. Bridge-stabilized oscillator with feedback control circuit 100 is less expensive to construct and has a significantly smaller footprint than other high performance oscillators that operate in such ranges. Oscillator 100 can use a standard resistor 110 for the resistive load 110 in path 106, and any type of resonator 112 in path 108. Rather than trying to control imprecision or variability in resistor 110 by directly controlling the resistance of resistor 110, such imprecision or variability is compensated for by controlling the gain of each VGA 116a, 116b in first bridge path 106 and second bridge path 108, respectively, to maintain first bridge path 106 out of phase with respect to second bridge path 108, as well as maintain a slightly unbalanced gain difference between first bridge path 106 and second bridge path 108.

In the illustrated embodiment, resonator 112 is a metal-insulator-metal-capacitor 107 in parallel with a wire bond inductor 109, although any LC circuit can be used, which is significantly cheaper and smaller than a typical quartz crystal resonator found in prior art oscillators. Even more significant, oscillator 100 with metal-insulator-metal-capacitor 107 in parallel with a wire bond inductor 109 can have performance consistent with a resonator of a very high quality-factor, typically only seen in a quartz crystal resonator.

While the present invention has been particularly shown and described with reference to exemplary embodiments thereof, it should be understood by those of ordinary skill in the art that various changes, substitutions and alterations can be made herein without departing from the scope of the invention as defined by the appended claims and their equivalents.

What is claimed is:

1. An oscillator circuit, comprising:
   a bridge-stabilized oscillator having a first bridge path and a second bridge path;
   a variable gain amplifier in each of the first bridge path and the second bridge path; and
   a power detector detecting a sum of an output of the first bridge path and an output of the second bridge path and for providing a control signal to each of the variable gain amplifiers in the first bridge path and the second bridge path.

2. The oscillator of claim 1, and further comprising an RF amplifier for converting a single input signal to a first bridge input signal and a second bridge input signal.

3. The oscillator of claim 2, wherein the bridge-stabilized oscillator further comprises a resistor connected in series with the variable gain amplifier in the first bridge path and a resonator connected in series with the variable gain amplifier in the second bridge path.

4. The oscillator of claim 3, wherein the resonator further comprises a metal-insulator-metal-capacitor in parallel with a wire bond inductor.

5. The oscillator of claim 3, and further comprising a variable phase shifter combined in a feedback loop between the power detector and the RF amplifier.

6. The oscillator of claim 5, wherein the variable phase shifter is adapted for receiving a tuning signal for modifying a resonance frequency of the bridge-stabilized oscillator.

7. The oscillator of claim 6, wherein the oscillator is constrained to a single piece of semiconductor.

8. The oscillator of claim 7, and further comprising a source external to the single piece of semiconductor for providing the tuning signal.

9. An oscillator circuit, comprising:
   an RF amplifier for converting a single input signal to a first bridge input signal and a second bridge input signal;
   a first bridge path and a second bridge path connected to the RF amplifier for receiving the first bridge input signal and the second bridge input signal;
   a variable gain amplifier in each of the first bridge path and the second bridge path for receiving and modifying the first bridge input signal and the second bridge input signal;
   a resistor connected in series with the variable gain amplifier in the first bridge path;
   a resonator connected in series with the variable gain amplifier in the second bridge path; and
   a power detector for detecting a sum of an output of the first bridge path and an output of the second bridge path and for providing a control signal to each of the variable gain amplifiers in the first bridge path and the second bridge path for maintaining a phase relationship between the first bridge input signal and the second bridge input signal.

10. The oscillator of claim 9, wherein the resonator further comprises one chosen from a metal-insulator-metal-capacitor in parallel with a wire bond inductor and a metal-insulator-metal-capacitor in series with a wire bond inductor.

11. The oscillator of claim 9, and further comprising a variable phase shifter combined in a feedback loop between the power detector and the RF amplifier.

12. The oscillator of claim 11, wherein the variable phase shifter is adapted for receiving a tuning signal for modifying a resonance frequency of the oscillator.

13. The oscillator of claim 9, wherein the oscillator is constrained to a single piece of semiconductor.

14. The oscillator of claim 13, wherein the variable phase shifter is adapted for receiving a tuning signal from a source external to the single piece of semiconductor for modifying a resonance frequency of the oscillator.

15. The oscillator of claim 9, wherein the oscillator is adapted for providing an output signal greater than 1 Mhz.

16. An oscillator circuit, comprising:
   an RF amplifier for converting a single input signal to a first bridge input signal and a second bridge input signal;

a first bridge path and a second bridge path connected to the RF amplifier for receiving the first bridge input signal and the second bridge input signal;

a variable gain amplifier in each of the first bridge path and the second bridge path for receiving and modifying the first bridge input signal and the second bridge input signal;

a resistive load connected in series with the variable gain amplifier in the first bridge path;

a resonator connected in series with the variable gain amplifier in the second bridge path;

a first feedback loop for receiving an output of the first bridge path and for providing a first control signal to the variable gain amplifier in the first bridge path for modifying the first bridge input signal; and a second feedback loop for receiving an output of the second bridge path and for providing a second control signal to the variable gain amplifier in the second bridge path for modifying the second bridge input signal.

17. The oscillator of claim 16, and further comprising a power detector in the first feedback loop for detecting the output of the first bridge path and for providing the first control signal.

18. The oscillator of claim 16, and further comprising a power detector in the second feedback loop for detecting the output of the second bridge path and for providing the first control signal.

19. The oscillator of claim 16, wherein the resonator further comprises one chosen from a metal-insulator-metal-capacitor in parallel with a wire bond inductor and a metal-insulator-metal-capacitor in series with a wire bond inductor.

20. The oscillator of claim 19, and further comprising a variable phase shifter combined in a feedback loop between the output of the first bridge path and the second bridge path and the RF amplifier, wherein the variable phase shifter is adapted for receiving a tuning signal for modifying a resonance frequency of the oscillator, and wherein the oscillator is adapted for oscillating at any frequency greater than 100 Mhz.

* * * * *